United States Patent
Wu

(10) Patent No.: US 11,641,213 B2
(45) Date of Patent: *May 2, 2023

(54) LOG-LIKELIHOOD RATIO MAPPING TABLES IN FLASH STORAGE SYSTEMS

(71) Applicant: Beijing Tenafe Electronic Technology Co., Ltd., Beijing (CN)

(72) Inventor: Yingquan Wu, Palo Alto, CA (US)

(73) Assignee: Beijing Tenafe Electronic Technology Co., Ltd.

(*) Notice: Subject to any disclaimer, the term of this patent is extended or adjusted under 35 U.S.C. 154(b) by 0 days.

This patent is subject to a terminal disclaimer.

(21) Appl. No.: 17/667,864

(22) Filed: Feb. 9, 2022

(65) Prior Publication Data

US 2022/0416812 A1 Dec. 29, 2022

Related U.S. Application Data

(63) Continuation of application No. 17/357,328, filed on Jun. 24, 2021, now Pat. No. 11,283,468.

(51) Int. Cl.
*G11C 29/00* (2006.01)
*H03M 13/11* (2006.01)
*G06F 11/10* (2006.01)

(52) U.S. Cl.
CPC ..... *H03M 13/1125* (2013.01); *G06F 11/1068* (2013.01)

(58) Field of Classification Search
CPC .......... G06F 11/1068; H03M 13/1125
See application file for complete search history.

(56) References Cited

U.S. PATENT DOCUMENTS

| | | | |
|---|---|---|---|
| 2007/0274417 A1* | 11/2007 | Menon | H04L 1/206 375/332 |
| 2013/0163328 A1 | 6/2013 | Seyhan | |
| 2015/0052408 A1 | 2/2015 | Lee | |
| 2019/0288707 A1* | 9/2019 | Kumar | G06F 3/0614 |

OTHER PUBLICATIONS

Chen et al., "Reduced-Complexity Decoding of LDPC Codes", IEEE Transactions on Communications, vol. 53, No. 8, Aug. 2005.
Hatami et al., "A Threshold-Based Min-Sum Algorithm to Lower the Error Floors of Quantized LDPC Decoders", IEEE Transactions on Communications, vol. 68, No. 4, Apr. 2020.

(Continued)

*Primary Examiner* — Samir W Rizk
(74) *Attorney, Agent, or Firm* — Van Pelt, Yi & James LLP

(57) ABSTRACT

Read data associated with Flash storage that is in a Flash storage state is received. One of a plurality of log-likelihood ratio (LLR) mapping tables is selected based at least in part on: (1) the Flash storage state and (2) a decoding attempt count associated with a finite-precision low-density parity-check (LDPC) decoder. A set of one or more LLR values is generated using the read data and the selected LLR mapping table, where each LLR value in the set of LLR values has a same finite precision as the finite-precision LDPC decoder. The finite-precision LDPC decoder generates the error-corrected read data using the set of LLR values and outputs it.

19 Claims, 9 Drawing Sheets

(56) References Cited

OTHER PUBLICATIONS

Kudekar et al., "The Effect of Saturation on Belief Propagation Decoding of LDPC Codes", 2014 IEEE International Symposium on Information Theory.
Richardson et al., "The Capacity of Low-Density Parity-Check Codes Under Message-Passing Decoding", IEEE Transactions on Information Theory, vol. 47, No. 2, Feb. 2001.
Tolouei et al., "Lowering the Error Floor of LDPC Codes Using Multi-Step Quantization", IEEE Communications Letters, vol. 18, No. 1, Jan. 2014.
Tom Richardson, "Error Floors of LDPC Codes", pp. 1426-1435, Oct. 2003.
Zhang et al., "Design of LDPC Decoders for Improved Low Error Rate Performance: Quantization and Algorithm Choices", IEEE Transactions on Wireless Communications, vol. 8, No. 11, Nov. 2009.
Zhang et al., "Quantized Iterative Message Passing Decoders with Low Error Floor for LDPC Codes", IEEE Transactions on Communications, vol. 62, No. 1, Jan. 2014.
Zhao et al., "On Implementation of Min-Sum Algorithm and Its Modifications for Decoding Low-Density Parity-Check (LDPC) Codes", IEEE Transactions on Communications, vol. 53, No. 4, Apr. 2005.

\* cited by examiner

LLR Mapping Table 1 ← 300

| Read Bit | LLR Value (4-Bit Precision) |
|---|---|
| 0 | 6 |
| 1 | -6 |

Lowest Average Number of Decoding Iterations

⇩ LDPC Decoding Failure

LLR Mapping Table 2 ← 301

| Read Bit | LLR Value (4-Bit Precision) |
|---|---|
| 0 | 4 |
| 1 | -4 |

⇩ LDPC Decoding Failure

LLR Mapping Table 3 ← 302

| Read Bit | LLR Value (4-Bit Precision) |
|---|---|
| 0 | 5 |
| 1 | -5 |

FIG. 3

LLR Mapping Table 4  ← 600

| Read Bits (Reliab., Val.) | LLR Value (4-Bit Precis.) | Read Bits (Reliab., Val.) | LLR Value (4-Bit Precis.) |
|---|---|---|---|
| 10 | 6 | 01 | -2 |
| 00 | 2 | 11 | -6 |

LDPC Decoding Failure

LLR Mapping Table 5  ← 601

| Read Bits (Reliab., Val.) | LLR Value (4-Bit Precis.) | Read Bits (Reliab., Val.) | LLR Value (4-Bit Precis.) |
|---|---|---|---|
| 10 | 4 | 01 | -2 |
| 00 | 2 | 11 | -4 |

LDPC Decoding Failure

LLR Mapping Table 6  ← 602

| Read Bits (Reliab., Val.) | LLR Value (4-Bit Precis.) | Read Bits (Reliab., Val.) | LLR Value (4-Bit Precis.) |
|---|---|---|---|
| 10 | 5 | 01 | -2 |
| 00 | 2 | 11 | -5 |

LOG-LIKELIHOOD RATIO MAPPING TABLES IN FLASH STORAGE SYSTEMS

CROSS REFERENCE TO OTHER APPLICATIONS

This application is a continuation of U.S. patent application Ser. No. 17/357,328 entitled LOG-LIKELIHOOD RATIO MAPPING TABLES IN FLASH STORAGE SYSTEMS filed Jun. 24, 2021 which is incorporated herein by reference for all purposes.

BACKGROUND OF THE INVENTION

Flash storage systems store information in the form of charge. Over time, the Flash storage medium deteriorates as the number of program or erase cycles adds up, making the Flash storage medium "leaky" and introducing errors into the stored data. High temperature can also introduce errors into the stored data. Many Flash storage systems use low-density parity-check (LDPC) codes to remove errors from the data stored on the Flash storage medium.

There are multiple techniques and/or approaches for implementing an LDPC decoding system. Iterative message-passing (MP) decoding is one of the most efficient ways to achieve near-optimal performance when decoding LDPC-encoded data. The min-sum decoding technique (a type of MP decoder) is attractive because of its low complexity. New Flash storage and/or LDPC systems which are optimized for and/or improve the performance of specific LDPC decoder approaches (e.g., iterative MP decoding, min-sum decoding, etc.) would be desirable. For example, it would be desirable if such new Flash storage and/or LDPC systems reduced power consumption and/or decoding latency.

BRIEF DESCRIPTION OF THE DRAWINGS

Various embodiments of the invention are disclosed in the following detailed description and the accompanying drawings.

FIG. 3 is a diagram illustrating an embodiment of LLR mapping tables with 1-bit inputs and 4-bit outputs.

DETAILED DESCRIPTION

Figure 1:
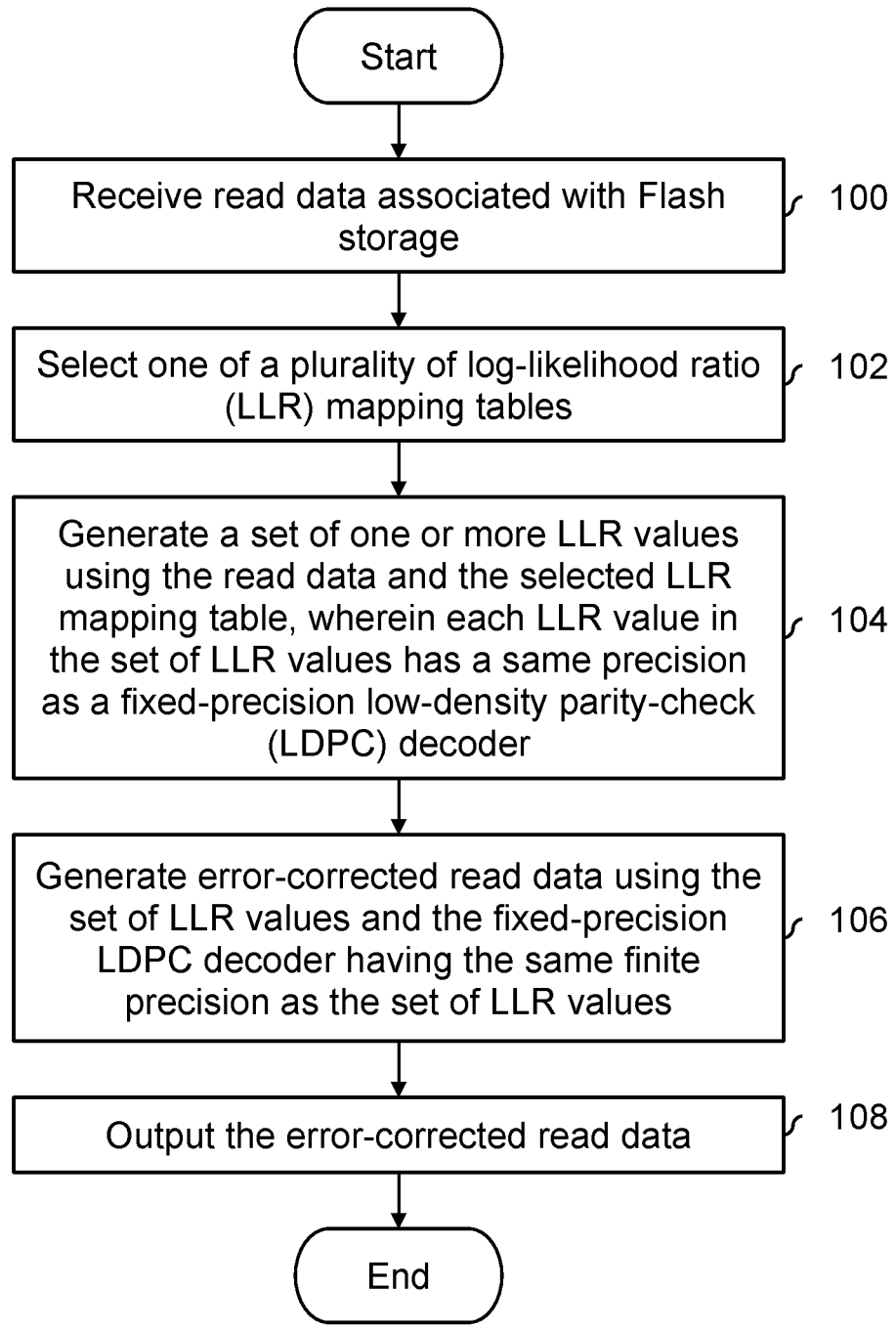
FIG. 1 is a flowchart illustrating an embodiment of a process to perform low-density parity-check (LDPC) decoding using a plurality of log-likelihood ration (LLR) mapping tables.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A low-density parity-check (LDPC) code may be conveniently represented by a bipartite graph, called a Tanner Graph. There are two types of nodes in a Tanner graph: variable nodes (VNs) and check nodes (CNs). Each variable node (or check node) corresponds to a column (or row) of the parity-check matrix (H). LDPC codes are attractive because they approach the Shannon limit.

Iterative MP decoders (a type of LDPC decoders) are popular because they can be implemented in efficient, high-speed software and/or hardware embodiments. A typical iterative message-passing (MP) decoder alternates between two phases: a "VN-to-CN" phase during which VNs send messages to CNs along their adjacent edges, and a "CN-to-VN" phase during which CNs send messages to their adjacent VNs. The messages are updated at each CN or VN using incoming information from adjacent edges (i.e., connected nodes). In the initialization step of the decoding process, VN i forwards the same message to all of its neighboring CNs, namely the log-likelihood ratio (LLR) value $L_{ch}^{i}$.

In some existing Flash storage systems that use LDPC codes, this LLR value ($L_{ch}^{i}$) used during the initialization step is obtained from a Flash channel model that sits between the Flash storage medium and the LDPC decoder (e.g., in a Flash storage read interface). The Flash channel model is estimated off-line and its associated parameters are adjusted over time, for example, as the Flash storage medium deteriorates (e.g., depending on the number of program or erase cycles experienced by the Flash storage medium, the temperature, etc.). It is noted that with a Flash channel model, an LLR value ($L_{ch}^{i}$) is dynamically calculated for each data bit. Not surprisingly, using a Flash channel model to generate the LLR values ($L_{ch}^i$) that are input to iterative MP (LDPC) decoders is resource intensive and/or has a substantial latency.

Various embodiments of a technique to use multiple LLR mapping tables to generate LLR values that are input to a finite-precision LDPC decoder are described herein. In some embodiments, the finite-precision LDPC decoder includes an iterative MP decoder and/or a min-sum decoder. In some embodiments, the LLR mapping tables are optimized to avoid certain saturation-related artifacts and/or noise floors that some finite-precision LDPC decoders are susceptible to that infinite-precision and/or "perfect" LDPC decoders are not susceptible to. For example, the LLR mapping tables may deliberately avoid or exclude the maximum (possible) magnitude for a given number of bits to avoid artifacts and/or error traps that result from saturation due to large magnitudes. Various embodiments are described in more detail below.

FIG. 1 is a flowchart illustrating an embodiment of a process to perform low-density parity-check (LDPC) decoding using a plurality of log-likelihood ration (LLR) mapping tables. In some embodiments, the process of FIG. 1 is performed by an LDPC decoding system. For example, such an LDPC decoding system may include an LLR mapping block with multiple LLR mapping tables, as well as a finite-precision LDPC decoder. In some embodiments, the LDPC decoding system communicates with a (e.g., separate) Flash storage read interface (e.g., implemented on a different device or system). Alternatively, the LDPC decoding system may be integrated with the Flash storage read interface (e.g., on the same device or system).

At 100, read data associated with Flash storage is received. For example, the read data may be received from a Flash storage read interface which in turn interfaces with Flash storage. In Flash storage, information is stored as charge. Conceptually, a read of Flash storage is performed by comparing the stored charge against one or more read thresholds where the number of read thresholds depends on the number of bits stored per cell. In various embodiments, a cell may store a single bit (e.g., single-level cell (SLC)), two bits (e.g., multi-level cell (MLC)), and so on. To use a single-level cell (SLC) example, if the stored charge exceeds the read threshold, then a 0 is output as the read bit (as an example); if the stored charge does not exceed the particular read threshold, then a 1 is output as the read bit.

In various embodiments, the read data received at step 100 (e.g., from a Flash storage read interface) includes hard read data or soft read data. For example, if the particular implementation of the Flash storage read interface is configured to output hard read data, then the Flash storage read interface to SLC Flash storage (as an example) outputs a value of 0 or 1 for each cell without any indication of the reliability or certainty associated with that (e.g., read) value.

Alternatively, if the read data received at step 100 is soft read data (e.g., because the Flash storage read interface is so configured), then both a (e.g., read or reported) value as well as an associated certainty, confidence, or reliability in that value are output by the Flash storage read interface. For example, the Flash storage read interface may perform multiple reads using different read thresholds and use those multiple sets of (e.g., raw) data to generate the (e.g., read or reported) value and the associated reliability. As a practical matter, many current Flash storage systems return a maximum of 2 bits of reliability information due to the amount of internal circuit complexity that grows exponentially with each bit of reliability information. It is noted that generating soft read data is time consuming and processing resource intensive (e.g., because performing multiple reads of the Flash storage medium is time consuming and processing resource intensive).

At 102, one of a plurality of log-likelihood ratio (LLR) mapping tables is selected. For example, there may be a predefined order or sequence in which the LLR mapping tables are selected and used. For example, a first LLR mapping table may be selected to generate a first set of LLR values, then a second LLR mapping table is selected (if needed) to generate a second set of LLR values, and so on. In some embodiments, the (next) LLR mapping table to use is selected dynamically and/or in real-time (e.g., based on information from a previous decoding attempt). For instance, if the current set of LLR values results in unusually large amounts of unsatisfied checks (e.g., determined by comparing the number of unsatisfied checks against some threshold, where the threshold may be fixed or alternatively based on a moving average over some recent window of time or attempts), then the maximum value of the next LLR set is selected to be smaller.

As will be described in more detail below, in some embodiments, the first LLR mapping table that is selected (e.g., when a new block of data is read from Flash storage media) depends upon the state of the Flash storage media. For example, if the Flash storage media is "leaky" because it has experienced a high number of programs and/or erases which wear out the Flash storage media and/or because the Flash storage media is hot (both of which increase the number of errors in (e.g., raw) read data), in some embodiments, the system begins with an LLR mapping table that is associated with a lowest error floor. Alternatively, at the beginning of the Flash storage media and/or when the Flash storage media is cool, the error rate may be lower and an LLR mapping table that is associated with a lowest average number of iterations (which is good for power conservation and/or latency) is selected initially and/or first (e.g., when a new block of data is read from Flash storage media).

At 104, a set of one or more LLR values is generated using the read data and the selected LLR mapping table, wherein each LLR value in the set of LLR values has a same precision as a finite-precision low-density parity-check (LDPC) decoder. In one example described in more detail below, an LLR mapping block generates LLR values with four (4) bits of precision (e.g., because a downstream LDPC decoder is configured to input LLR values with that level of precision).

At 106, error-corrected read data is generated using the set of LLR values and the finite-precision LDPC decoder having the same finite precision as the set of LLR values. That is, the level or amount of precision in the LLR values generated at step 104 is deliberately and/or specifically matched to the finite precision of the LDPC decoder. In some embodiments, an LLR mapping table (e.g., which performs steps 100 and 102) and an LDPC decoder (e.g., which performs steps 104, 106, and 108) are implemented in the same system or device (e.g., the same ASIC or FPGA) and so the level or degree of finite precision of the LDPC decoder is known and the LLR mapping table can be designed and/or configured accordingly.

At 108, the error-corrected read data is output. For example, if the syndromes in an LDPC decoder are all-zero at the end of a decoding iteration, then a decoding success is declared and the error-corrected data is output by the LDPC decoder. In some embodiments, the error-corrected read data is output to an application that presents or displays the stored information to a user.

It may be helpful to illustrate a block diagram of an exemplary system that performs the process recited in FIG. 1. The following figure describes one such exemplary system.

Figure 2:
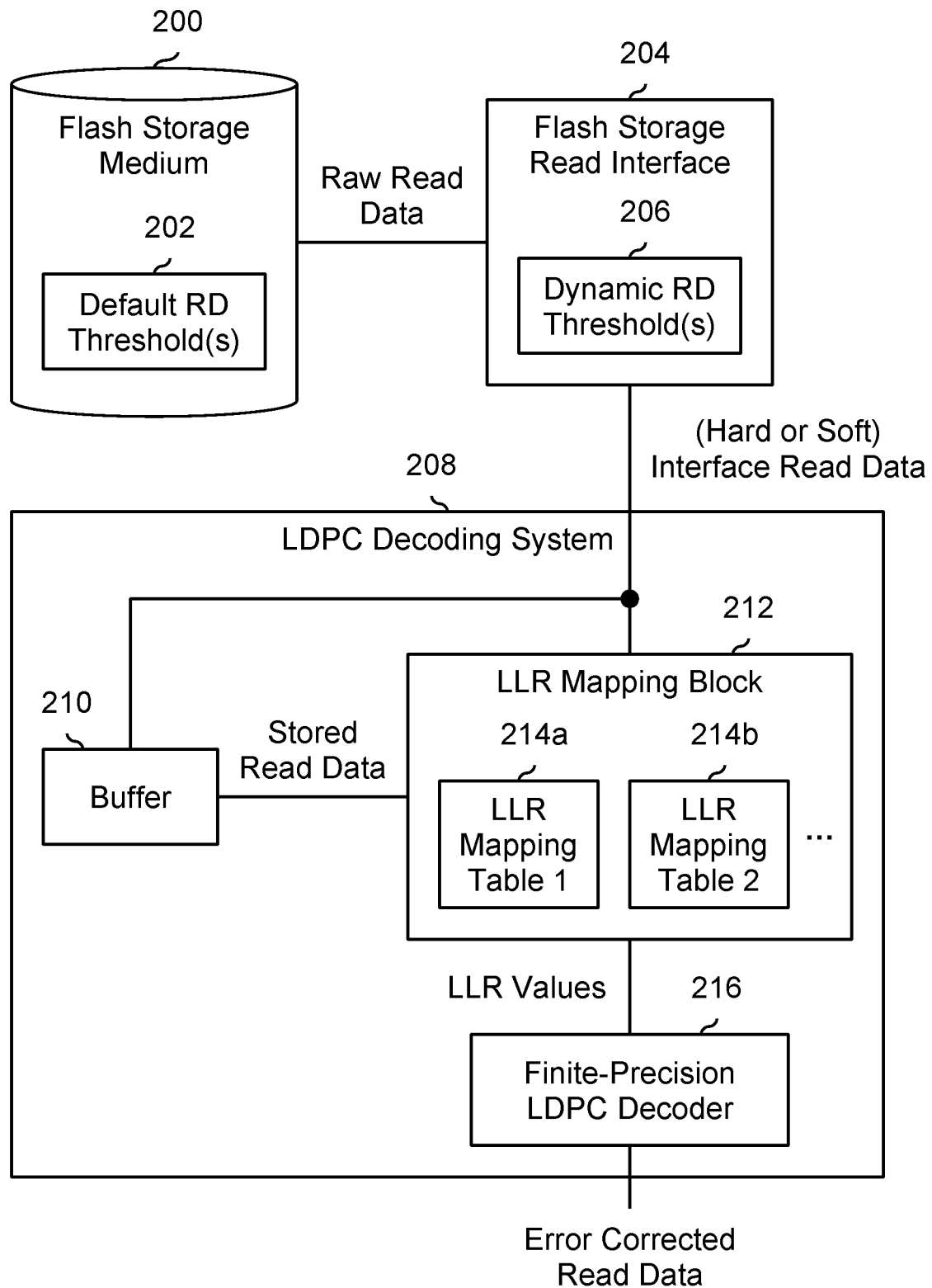
FIG. 2 is a diagram illustrating an embodiment of an LDPC decoding system that includes multiple LLR tables.

FIG. 2 is a diagram illustrating an embodiment of an LDPC decoding system that includes multiple LLR tables. In some embodiments, some or all of the blocks shown here are implemented in hardware (e.g., in an application-specific integrated circuit (ASIC), a field-programmable gate array (FPGA), etc.).

The Flash storage (200) stores information in the form of charge. In this example, the Flash storage (200) is pre-programmed with one or more default read threshold(s) (202) which is/are the default threshold(s) used to perform reads. (Alternatively, the Flash storage read interface (204) may provide to or program the Flash storage (200) with one or more dynamic read threshold(s) (206) to use instead.) In the case of SLC cells (i.e., single-bit cells), the raw read bit is either a 0 (e.g., the stored charge exceeds the read threshold) or a 1 (e.g., the stored charge does not exceed the read threshold) for a given SLC cell. The raw read data (e.g., comprising a sequence of raw read bits) is passed from the Flash storage (200) to the Flash storage read interface (204).

The Flash storage read interface (204) passes interface read data to the LDPC decoding system with multiple LLR tables (208). The interface read data is referred to as such because it comes from the Flash storage read interface (204) and to differentiate it from the raw read data from the Flash storage (200).

In some embodiments, the raw read data from the Flash storage (200) is identical to the interface read data from the Flash storage read interface (204). For example, the Flash storage read interface (204) may be configured to output hard read data and the raw read data from the Flash storage (200) passes through the Flash storage read interface (204) without modification.

Alternatively, the raw read data from the Flash storage (200) is not identical to the interface read data from the Flash storage read interface (204) in some embodiments. For example, the Flash storage read interface (204) may be configured to output soft interface read data. In some such embodiments, the Flash storage read interface (204) does this by performing multiple reads of the Flash storage (200) using different read thresholds in order to obtain multiple sets of raw read data. The Flash storage read interface (204) then uses the multiple sets of raw read data to generate the soft interface read data.

In some embodiments, the Flash storage read interface (204) performs additional operations and/or processes to the raw read data in order to generate the interface read data. For example, the data stored on the Flash storage (200) may be scrambled and the Flash storage read interface (204) may de-scramble the raw read data in order to generate the interface read data. This is merely exemplary and is not intended to be limiting.

The Flash storage read interface (204) passes the interface read data to an LDPC decoding system (208). Inside the LDPC decoding system (208), a copy of the interface read data is stored by a buffer (210). The interface read data is also input to an LLR mapping block (212) which includes multiple LLR mapping tables (214a-214b). For simplicity and ease of explanation, the LLR mapping block (212) in this example and the following figures progresses through the LLR mapping tables (214a-214b) in predefined and/or fixed order: the first LLR mapping table (214a) is selected and used first, then the second LLR mapping table (214b), and so on. As such, the appropriate LLR mapping table is selected based on the LDPC decoding attempt number or index (at least in this example). In some embodiments, an LLR mapping table is selected based on real-time information or parameters (e.g., information from the previous LDPC decoding attempt that failed). For instance, an unusually large number of unsatisfied checks indicates the next LLR table must be chosen with smaller values.

The LLR values are passed from the LLR mapping block (212) to a finite-precision LDPC decoder (216). For example, the finite-precision LDPC decoder (216) may have or otherwise be configured to input LLR values with 4-bit precision and the LLR values generated by LLR mapping block (212) are configured to match that level of bit precision. In this example, LDPC decoder (216) performs up to a maximum number of decoding iterations for this initial decoding attempt. If the syndromes are all-zero after any of the decoding iterations, then a decoding success is declared and the error-corrected read data is output by the LDPC decoding system (208).

If the LDPC decoder (216) reaches the maximum number of decoding iterations without success, the LDPC decoder (216) is stopped or otherwise halted and a new set of LLR values is obtained from the LLR mapping block (212) using a different LLR mapping table (e.g., the next LLR mapping table in the predefined order). When generating LLR values the second time or later, interface read data that is stored in the buffer (210) is obtained and used. By using the stored read data from the buffer, a re-read of the Flash storage (200) can be avoided. This is desirable because (re-)reading the Flash storage (200) is overwhelmingly more expensive (e.g., in terms of power and latency) compared to other operations in the system shown here.

The second set of LLR values (e.g., generated from the second LLR mapping table (214b)) is passed from the LLR mapping block (212) to the finite-precision LDPC decoder (216) which (e.g., after being reset) begins decoding using the second set of LLR values. If the finite-precision LDPC decoder (216) is again unsuccessful after a maximum number of decoding iterations, then a third set of LLR values is generated using a third LLR mapping table and the stored read values and so on.

Returning briefly to FIG. 1, the LLR mapping block (212) is an example of a device or block that performs step 100 (e.g., receiving stored read data from the buffer (210) or interface read data from the Flash storage read interface (204)), step 102, and step 104. The finite-precision LDPC decoder (216) is an example of a device or block that performs step 106.

In some embodiments, the finite-precision LDPC decoder (216) performs iterative message passing (MP) where the LDPC decoder switches between two phases: a VN-to-CN phase during which variable nodes send messages to check nodes along their adjacent edges, and a CN-to-VN phase during which check nodes send messages to their adjacent variable nodes. For example, in a CN-to-VN message update phase, check node j uses the incoming messages and check node update rule(s) to compute and forward a new CN-to-VN. Similarly, during the VN-to-CN message update phase, variable node i processes its incoming messages according to variable node update rule(s) and forwards. A quasi-cyclic (QC) structure is desirable because it enables efficient, high-speed software or hardware implementations. With iterative message passing, the decoder inputs LLR values.

In some embodiments, the finite-precision LDPC decoder (216) performs iterative min-sum decoding. Iterative min-sum decoding is a subset of iterative message passing where the CN update rule includes a minimum operation and a summation operation, hence the min-sum name. Like iterative message passing, a min-sum decoder inputs LLR values. It is noted that the LLR inputs to min-sum decoders may be scaled if desired whereas the inputs to some other types of LDPC decoders (such as sum-product decoders) must be precise and cannot be scaled.

The exemplary LDPC implementations and/or approaches described above (e.g., iterative MP decoding, min-sum decoding, etc.) are well known and for brevity additional details not directly related to the technique(s) described herein are not described.

The following figure describes some exemplary LLR mapping tables and their associated benefits.

FIG. 3 is a diagram illustrating an embodiment of LLR mapping tables with 1-bit inputs and 4-bit outputs. In some embodiments, the LLR mapping tables (214a-214b) in FIG. 2 are implemented as shown. As in the previous example, the LLR mapping tables (300-302) shown here have a predefined sequence or ordering in which they are used to generate LLR values for an LDPC decoder.

The first LLR mapping table (300) maps a read bit of 0 to an LLR value of 6 and a read bit of 1 to an LLR value of −6. In this example, the first LLR mapping table (300) of {−6; 6} is selected to be the first LLR mapping table because it has the lowest average number of iterations before LDPC decoding is successful (e.g., according to simulations). This is desirable over the long run because fewer decoding iterations means less power consumed and shorter latency considerations.

If LDPC decoding is unsuccessful using the LLR values generated using the first LLR mapping table (300), then the second LLR mapping table (301) is selected and used to generate a second set of LLR values. The second LLR mapping table (301) maps read bits of 0 to an LLR value of 4 and read bits of 1 to an LLR value of −4.

Simulations revealed that the second LLR mapping table (301) has the lowest error floor of all the LLR mapping tables that were simulated and therefore it was designated to be the second LLR mapping table in the sequence. Using the first LLR mapping table (300) of {−6; 6} is desirable as the first choice because it keeps power and latency down in the long run (and it is sufficient to decode many or most of the read data) but if LDPC decoding is unsuccessful with the first LLR mapping table of {−6; 6}, then using the second LLR mapping table (301) of {−4; 4} is an attractive next choice because it has the lowest error floor (e.g., and therefore has the best chance for successful decoding).

If LDPC decoding is still unsuccessful, then the third LLR mapping table (302) of {−5; 5} is selected and used to generate a third set of LLR values. For example, the LDPC decoder may be stuck in a trapping set but the third set of LLR values (with slightly different values) are sufficient to avoid or "pop out" of the trapping set and/or otherwise permit the LDPC decoder to properly converge on the error-corrected data.

In this example with 4-bit precision, the LLR values have a full or maximum range of [−7; 7] but none of the LLR mapping tables (e.g., {−6; 6} (300), {−4; 4} (301), and {−5; 5} (302)) use the full range and/or the maximum (possible) magnitude. Configuring LLR mapping tables (e.g., 300-302) to avoid the maximum (possible) magnitude (in this case, 7) may reduce or mitigate certain artifacts that finite-precision LDPC decoders suffer from in some cases. For example, as finite-precision quantized values are processed (e.g., according to message passing update rules and/or using minimum and summation operations in min-sum decoding), artifacts may occur in some cases which would not occur in a perfect LDPC decoder with infinite precision. By using LLR mapping tables that produce LLR values that avoid the maximum possible magnitude for a given level of precision (e.g., don't generate LLR values with a magnitude of 7 for 4-bit precision), these saturation and/or finite-precision related artifacts may be mitigated and/or avoided. This in turn improves the performance of the LDPC decoder (e.g., better chance of successful decoding).

As shown here, in some embodiments, none of the plurality of LLR mapping tables map to an LLR value that has a maximum magnitude associated with the finite precision. For example, none of the exemplary LLR mapping tables (300-302) in FIG. 3 map to an LLR value with a magnitude of 7.

The following figure illustrates an example of (frame) error rate performance when different LLR mapping tables are used.

Figure 4:
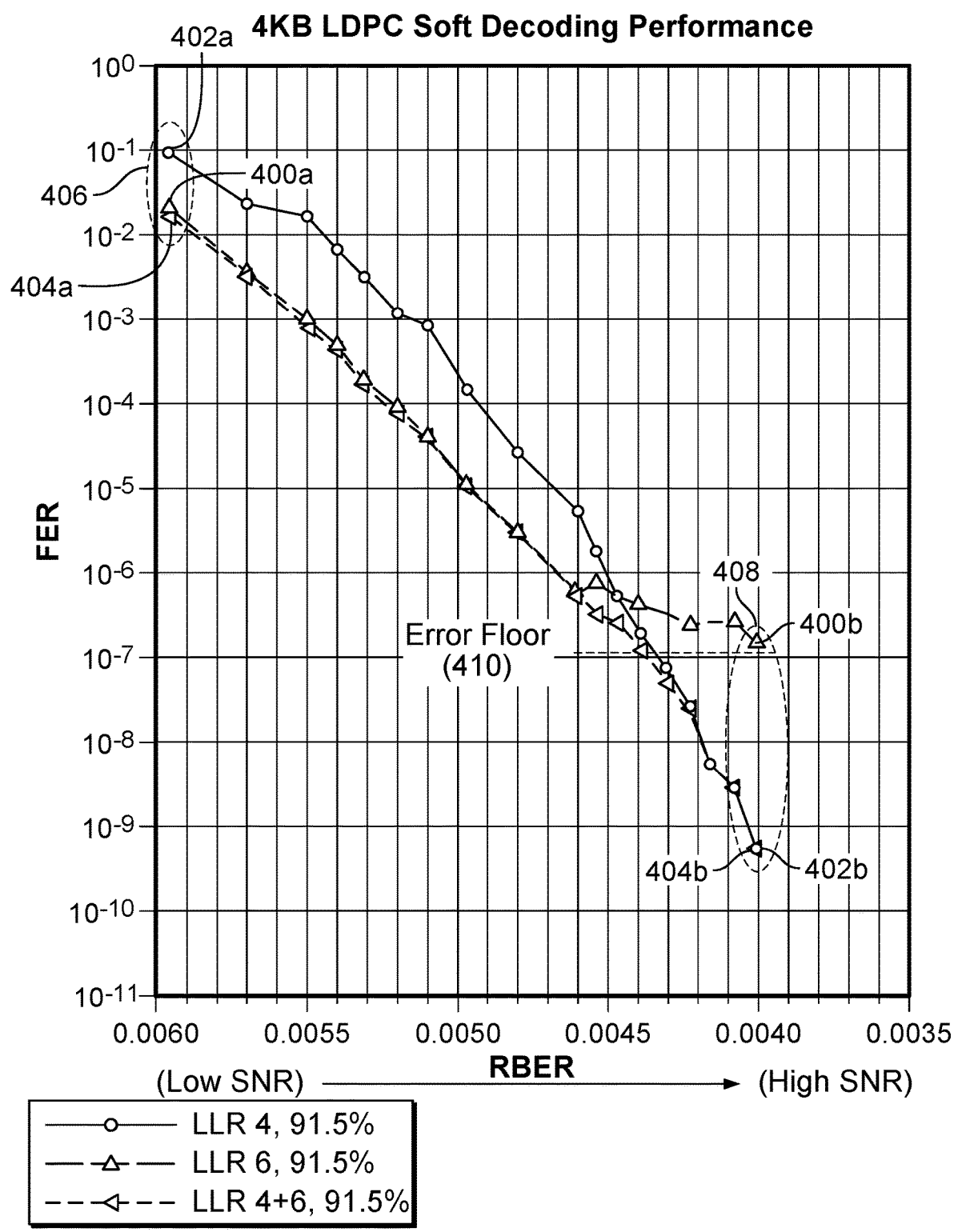
FIG. 4 is a graph illustrating an embodiment of frame error rates associated with LLR mapping tables that generate 4-bit precision LLR values for a soft LDPC decoder.

FIG. 4 is a graph illustrating an embodiment of frame error rates associated with LLR mapping tables that generate 4-bit precision LLR values for a soft LDPC decoder. In the example shown, the x-axis of the graph shows residual bit error rate (RBER) (e.g., in the read data), and the y-axis shows frame error rate (FER) after soft decoding (e.g., inputs reliability information) by an LDPC decoder with 4-bit precision that decodes 4 kB of read data at a time. Note that the RBER values are in descending order going from left to right along the x-axis so the leftmost set of data points (406) is associated with decoding results when the read data is at a low SNR level and the rightmost set of data points (408) is associated with decoding results when the read data is at a high SNR level.

The first error performance function (which includes data points 402a and 402b) is associated with a 4-bit precision LLR mapping table of {−6; 6} with a code rate of 91.5%. As shown in this graph, at high SNR levels (see, e.g., data point 400b), the large LLR magnitudes of the {−6; 6} LLR mapping table (e.g., a magnitude of 6 out of a maximum magnitude of 7) produce some (nearly) saturated but erroneous messages lying in small error-prone substructures that become difficult to correct. Subsequently, this forms an error floor (410) which is undesirable because the system is unable to take advantage of better quality read data and cannot correspondingly produce better quality results.

To mitigate and/or break through this error floor (410), the high LLR magnitudes of the {−6; 6} LLR mapping table can be reduced to {−4; 4}. The second function (which includes data points 402a and 402b) shows the corresponding error performance for the {−4; 4} LLR mapping table with a code rate of 91.5%. Note that the high SNR data point (402b) for that LLR mapping table does not demonstrate a noticeable error floor. With the lower magnitude of the {−4; 4} LLR mapping table, the messages do not get stuck in the error-prone substructures as frequently as the larger magnitude {−6; 6} LLR mapping table.

Thus, even though at low SNR levels the {−4; 4} LLR mapping table (see data point 402a) has a slightly higher FER than the {−6; 6} LLR mapping table (see data point 400a), when evaluated and/or simulated over a range of RBER levels, the {−4; 4} LLR mapping table tends to more quickly decode the read data (e.g., has a lower or lowest average number of LDPC decoding iterations before decoding success). As described above, this is a desirable for power and/or performance reasons and so in some embodiments the {−4; 4} LLR mapping table is selected first.

The third dataset (which includes data points 404a and 404b) is associated with using the LLR mapping table of {−4; 4} and (if needed) the LLR mapping table of {−6; 6} if the first LLR mapping table is unsuccessful. It is noted that the combined use of both LLR mapping tables will always produce the lowest error floor amongst the three examples shown, but for the purposes of selecting which LLR mapping table to use first, those data points (e.g., 404a and 404b) are not relevant and therefore are not considered.

The following figure describes an example of a process where LLR mapping tables are selected based on a decoding attempt count.

Figure 5:
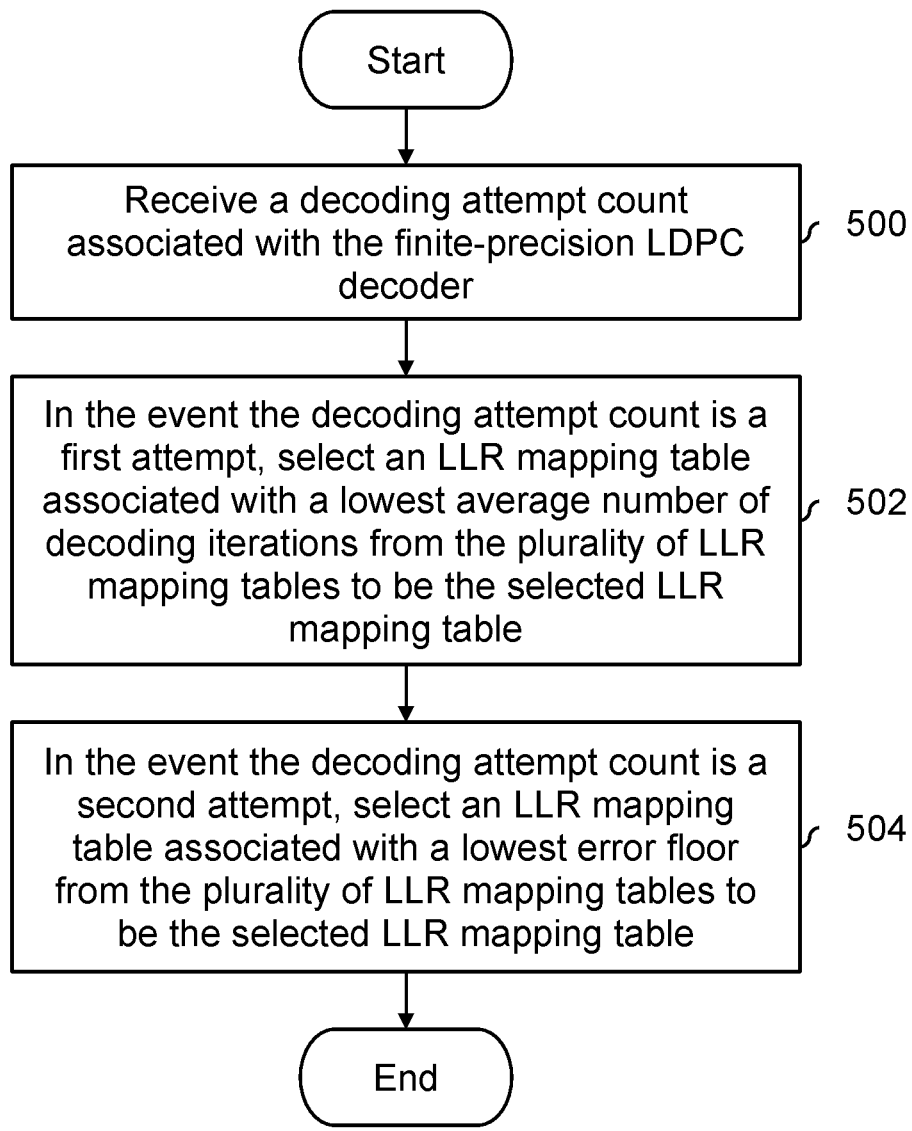
FIG. 5 is a flowchart illustrating an embodiment of a process to select an LLR mapping table based at least in part on a decoding attempt count.

FIG. 5 is a flowchart illustrating an embodiment of a process to select an LLR mapping table based at least in part on a decoding attempt count. In some embodiments, step 102 in FIG. 1 uses the process shown here to select an LLR mapping table from the plurality of LLR mapping tables. In the exemplary block diagram shown in FIG. 2, the LLR mapping block (212) may perform the example process described here.

At 500, a decoding attempt count associated with the finite-precision LDPC decoder is received. The count tracks which decoding attempt this is for the LDPC decoder. For example, if the count is one, then it is a first decoding attempt; if the count is two, then it is a second decoding attempt, and so on.

At 502, in the event the decoding attempt count is a first attempt (e.g., the count is one), an LLR mapping table associated with a lowest average number of decoding iterations is selected from the plurality of LLR mapping tables to be the selected LLR mapping table. For example, the first LLR mapping table (300) of {−6; 6} in FIG. 3 may be selected at step 502. As described above, it may be desirable for power and latency reasons to select and use the LLR mapping table associated with the lowest number of decoding iterations (e.g., before decoding is successful).

At 504, in the event the decoding attempt count is a second attempt, an LLR mapping table associated with a lowest error floor is selected from the plurality of LLR mapping tables to be the selected LLR mapping table. For example, the second LLR mapping table (301) of {−4; 4} in FIG. 3 may be selected at step 504. As described above, this mapping may have the best chance of successfully decoding any (interface) read data that remains uncorrected since it has the lowest error floor.

Returning briefly to FIG. 2, in some embodiments, the interface read data output by the Flash storage read interface (204) includes or comprises soft information (e.g., a reliability associated with the reported or read value). The following figure describes an example where the LLR mapping tables (214a-214b) are configured to input 2-bits of soft read data and output LLR values with 4-bit precision.

Figure 6:
FIG. 6 is a diagram illustrating an embodiment of LLR mapping tables with 2-bit soft inputs and 4-bit outputs.
Figure 6:

FIG. 6 is a diagram illustrating an embodiment of LLR mapping tables with 2-bit soft inputs and 4-bit outputs. In some embodiments, the LLR mapping tables (214a-214b) in FIG. 2 are implemented as shown. In this example, the read bit on the left is the reliability bit and the read bit on the right is the value bit. A reliability of 0 indicates that the corresponding read value is unreliable and a reliability of 1 indicates that the corresponding read value is reliable.

The fourth LLR mapping table (600) maps read bits of 10 (i.e., a read value of 0 that is reliable) to an LLR value of 6, read bits of 00 (i.e., a read value of 0 that is unreliable) to an LLR value of 2, read bits of 01 (i.e., a read value of 1 that is unreliable) to an LLR value of −2, and read bits of 11 (i.e., a read value of 1 that is reliable) to an LLR value of −6. In other words, the sign (e.g., + or −) of the generated LLR value indicates the value (e.g., a value of 0 or 1) and more reliable information has a larger magnitude (e.g., to more heavily influence the LDPC decoder). In this example, the fourth LLR mapping table (600) has the lowest average number of decoding iterations.

As in the previous, the LLR mapping tables (600-602) shown here have a predefined sequence or ordering in which they are used to generate LLR values for an LDPC decoder. The fourth LLR mapping table (600) is selected first to generate LLR values.

If LDPC decoding fails (e.g., after reaching a maximum number of iterations) then the fifth LLR mapping table (601) is selected and used which maps read bits of 10, 00, 01, and 11 to LLR values of 4, 2, −2, and −4, respectively. In this example, the fifth LLR mapping table (601) has the lowest error floor.

If LDPC decoding again fails then the sixth LLR mapping table (602) is selected and used which maps read bits of 10, 00, 01, and 11 to LLR values of 5, 2, −2, and −5, respectively.

Returning briefly to FIG. 3, in some embodiments, a system will first start out (e.g., at the beginning of an LDPC Flash storage system's lifetime when the Flash storage medium (200) has a low program-and-erase count) using hard (interface) read data because hard (interface) read data is less resource intensive to generate and there are relatively few errors at this point in the system's lifetime. To put this another way, hard (interface) read data and hard-input LLR mapping tables (300-302) in FIG. 3 are sufficient to error correct the stored data when the Flash storage medium (200) is new.

In some embodiments, if LDPC decoding is unsuccessful after going through all hard-input LLR mapping tables (e.g., 300-302 in FIG. 3), then soft (interface) read data is obtained (e.g., a Flash storage read interface is instructed to generate and/or obtain such soft information) and soft-input LLR mapping tables (e.g., 600-602 in FIG. 6) are used. The following figure describes an example of this.

Figure 7:
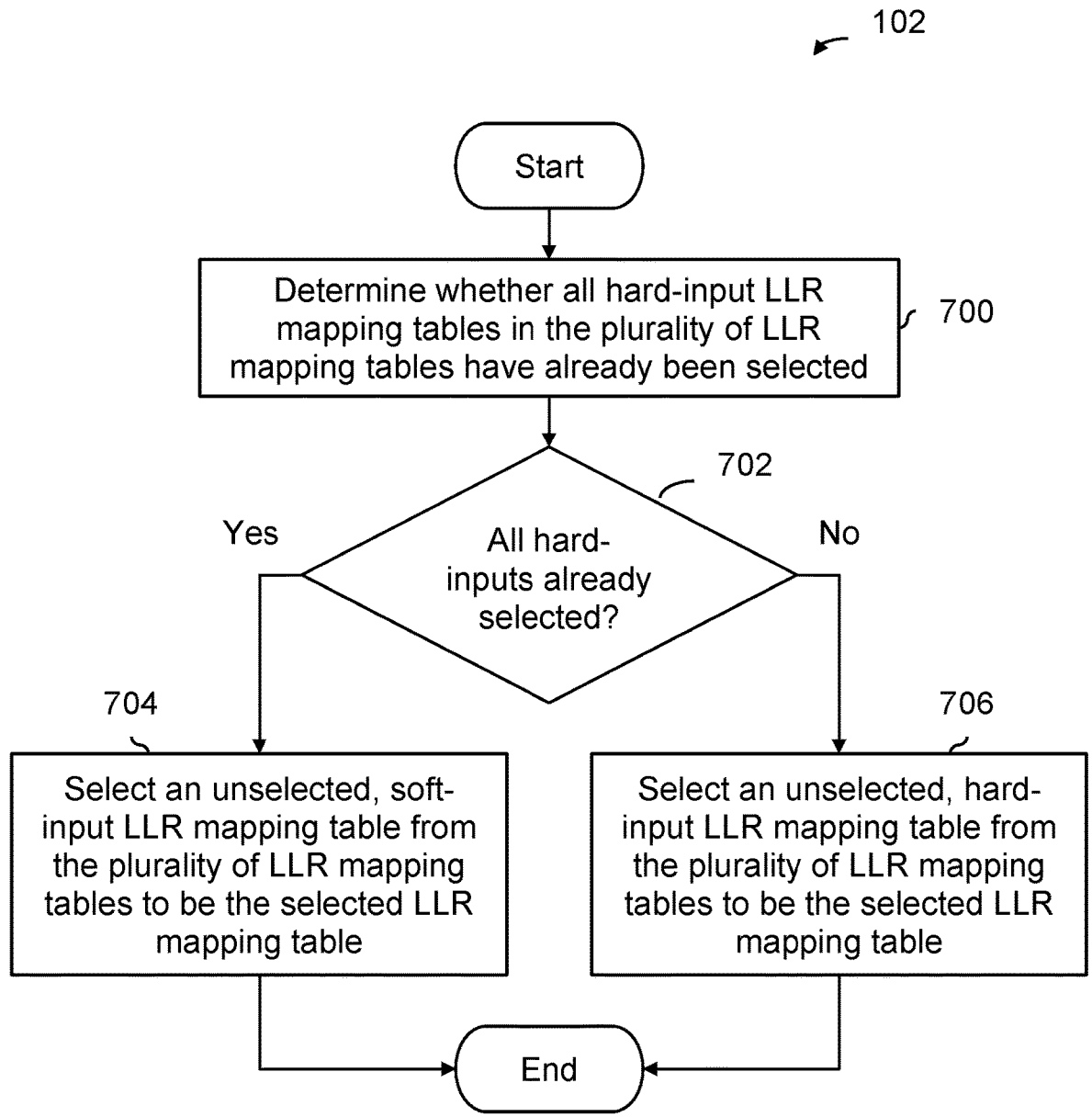
FIG. 7 is a flowchart illustrating an embodiment of a process to select a soft-input LLR mapping table when all hard-input LLR mapping tables have already been selected.

FIG. 7 is a flowchart illustrating an embodiment of a process to select a soft-input LLR mapping table when all hard-input LLR mapping tables have already been selected. In some embodiments, step 102 in FIG. 1 includes the process shown here to select an LLR mapping table from the plurality of LLR mapping tables. The LLR mapping block (212) in FIG. 2 is one example of a block that performs the example process described here.

At 700, it is determined whether all hard-input LLR mapping tables in the plurality of LLR mapping tables have already been selected. In FIG. 3, for example, there are three hard-input LLR mapping tables (300-302). In some cases, the added noise and/or errors may be so great (e.g., the Flash storage media may be very hot and/or be at the end of its lifetime and is therefore very "leaky") that all three LDPC decoding attempts fail using the three sets of LLR values generated from the three LLR mapping tables (300-302).

If at decision fork 702 all hard-input LLR mapping tables in the plurality of LLR mapping tables have not already been selected 702, then at 706 an unselected, hard-input LLR mapping table is selected from the plurality of LLR mapping tables to be the selected LLR mapping table. For example, if the second LLR mapping table (301) in FIG. 3 was previously selected then the third LLR mapping table (302) would be selected next.

Returning briefly to FIG. 2, it may be processing resource intensive and/or time consuming for the Flash storage read interface (204) to generate soft interface read data. As such, the system may prefer to try decoding the read data using hard (interface) read data until those LLR mapping tables (and corresponding LDPC decoding attempts) have been exhausted. Only then will the system switch to hard (interface) read data which is more processing resource intensive and/or time consuming.

If at decision fork 702 all hard-input LLR mapping tables in the plurality of LLR mapping tables have already been selected, then at 704 an unselected, soft-input LLR mapping table is selected from the plurality of LLR mapping tables to be the selected LLR mapping table. For example, in FIG. 6, the fourth LLR mapping table (600) would be selected next (e.g., because it is associated with the lowest average number of iterations, which is good for power conservation and/or latency).

The exemplary (sub-)process shown here relates to selecting LLR mapping tables. Outside of this (sub-)process, an LLR mapping block (e.g., 212 in FIG. 2) may communicate with a Flash storage read interface (e.g., 204 in FIG. 2) as or if needed to receive the appropriate type of interface read data (e.g., hard or soft) that matches the selected LLR mapping table. For example, step 100 in FIG. 1 may include requesting and receiving soft interface read data if an LLR mapping block only has hard interface read data.

As described above, there may be a predefined sequence or order in which LLR mapping tables are selected and used. In some embodiments, the system adaptively changes which LLR mapping table in the sequence is selected and used first (e.g., based on the SNR of the read data, a current state of the Flash storage media, a current state of the LDPC decoder, and/or the temperature of the Flash storage media, etc.). The following figures show an example of this.

Figure 8A:
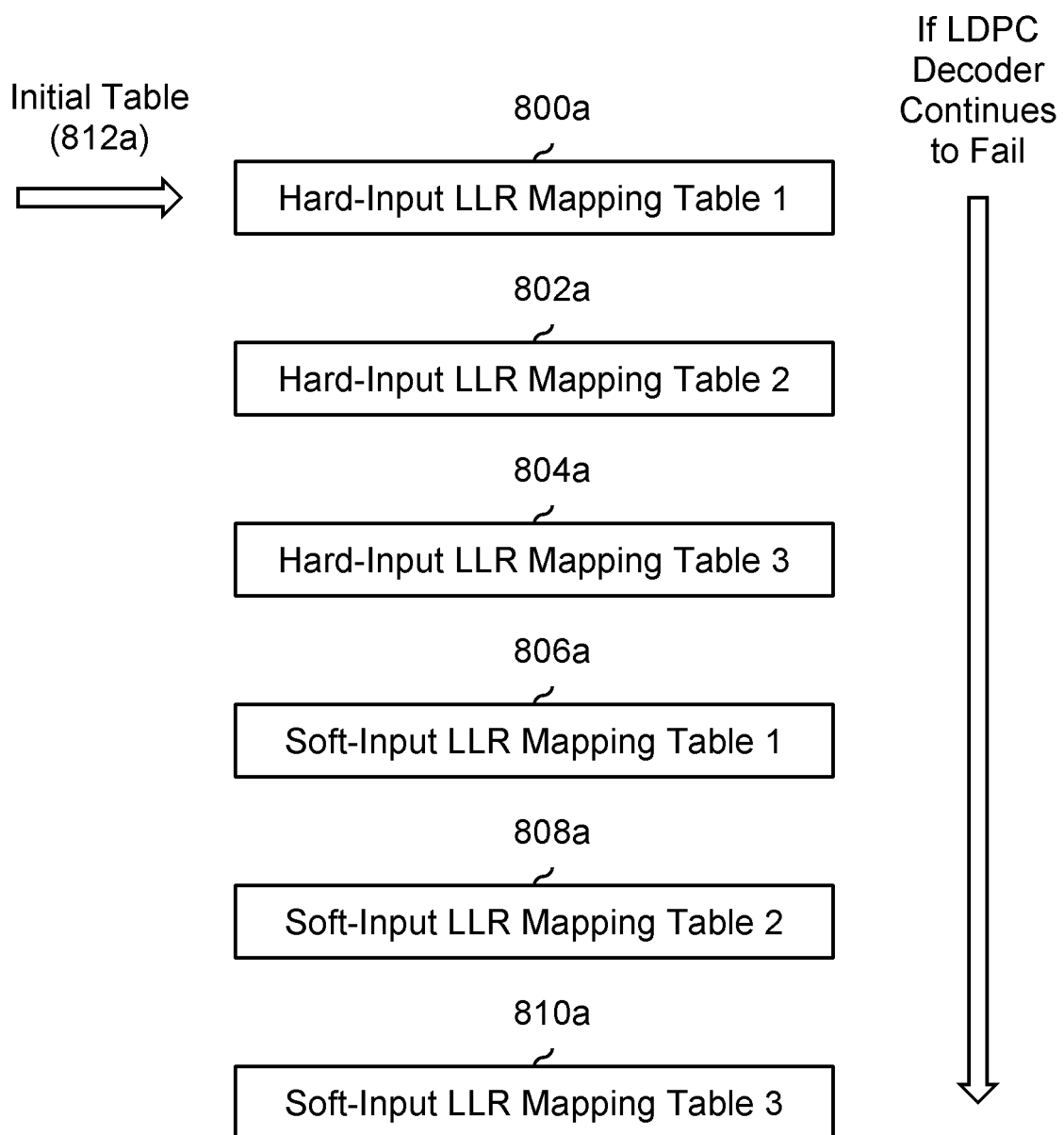
FIG. 8A is a diagram illustrating an embodiment of a sequence of LLR mapping tables that begins with a hard-input LLR mapping table when the Flash storage media is in a high SNR state.

FIG. 8A is a diagram illustrating an embodiment of a sequence of LLR mapping tables that begins with a hard-input LLR mapping table when the Flash storage media is in a high SNR state. For example, the Flash storage medium (200) in FIG. 2 may be at the beginning of its lifetime, the temperature may be cool (e.g., less than 30° C.), and/or the LDPC decoder may have infrequent and/or few decoding failures. These may all be indications that the Flash storage media is in a high SNR state. In this example, if the system determines that the Flash storage media is in such a high SNR state, the system selects the first hard-input LLR mapping table (800a) to be the initial table (812a), for example, when a new read instruction is received and new interface read data is output by a Flash storage read interface. In the event of continued LDPC decoder failures, the system will then go through the second and third hard-input LLR mapping tables (802a and 804a) and then the three soft-input LLR mapping tables (806a, 808a, and 810a) in that order.

Figure 8B:
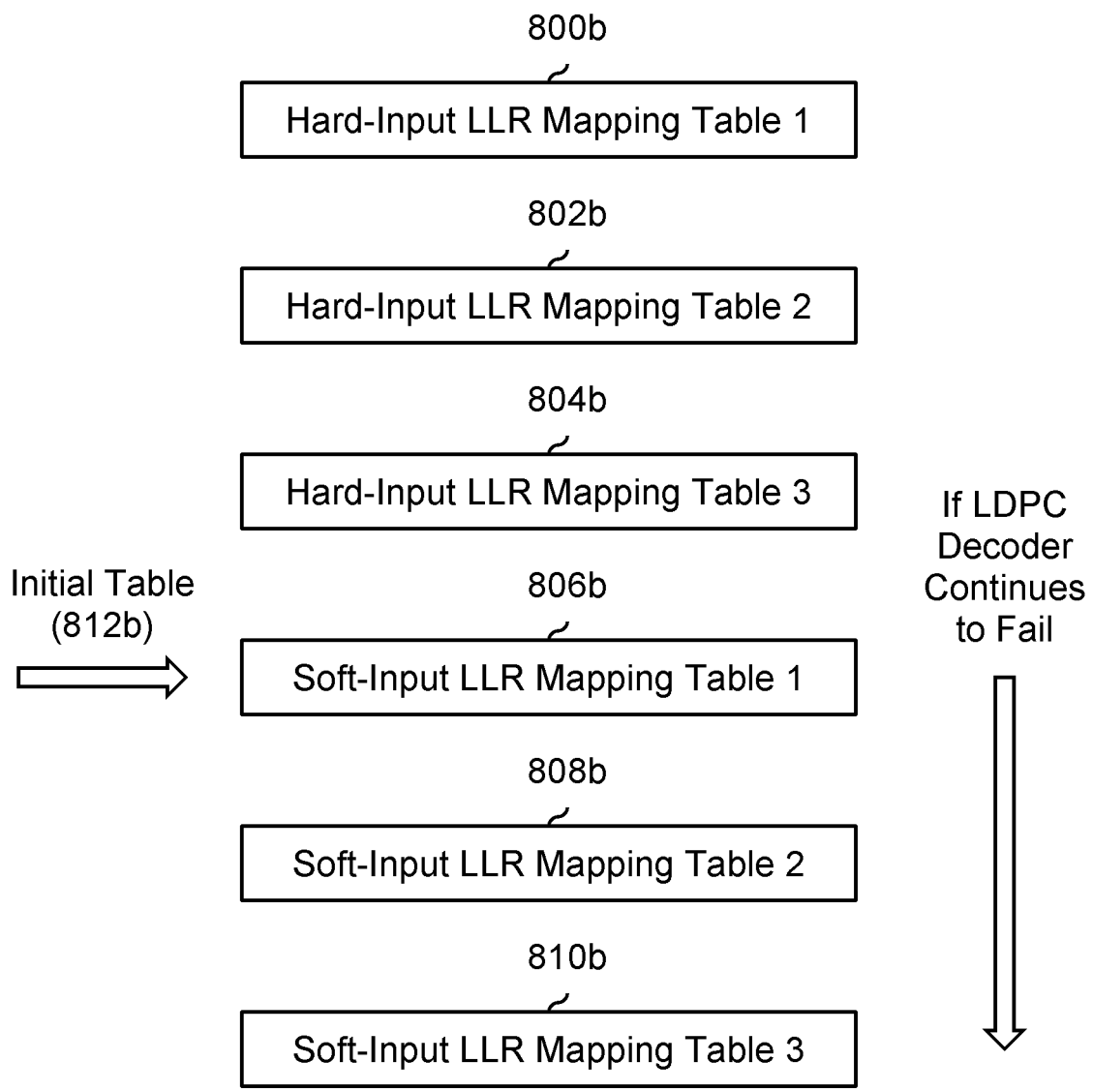
FIG. 8B is a diagram illustrating an embodiment of a sequence of LLR mapping tables that begins with a soft-input LLR mapping table when the Flash storage media is in a low SNR state.

FIG. 8B is a diagram illustrating an embodiment of a sequence of LLR mapping tables that begins with a soft-input LLR mapping table when the Flash storage media is in a low SNR state. In this example, the Flash storage media is in a low SNR state. For example, this may be a permanent condition if the Flash storage medium is at the end of its lifetime and the Flash storage medium is "leaky." Or, it may be a temporary condition if the Flash storage medium is new but is hot. In some embodiments, state information associated with and/or outputs from an LDPC decoder are used to determine if the Flash storage media is in a low SNR state (e.g., frequent LDPC decoding failures, over some window of recent attempts, and when compared against a threshold failure rate).

In this example, if the system determines that the Flash storage media is in a low SNR state (e.g., based on one or more of the inputs described above) then the system will use the first soft-input LLR mapping table (806b) as the initial table (812b), completely bypassing or otherwise skipping the hard-input LLR mapping tables (800b, 802b, and 804b), and using the second and third soft-input LLR mapping tables (808b and 810b) if the LDPC decoder continues to fail. Although it may be more expensive and/or time consuming at the beginning to obtain or generate soft interface read data (for use with the soft-input LLR mapping tables), the total read response time may be shorter because the system starts out with a stronger error correction capability when soft inputs are used (e.g., instead of initially wasting time with the less powerful hard inputs).

In some cases, some other LLR mapping is selected as the initial table. For example, if the second hard-input LLR mapping table (802b) has a lower error floor than the first hard-input LLR mapping table (800b) especially in low SNR conditions, then the second hard-input LLR mapping table (802b) may be selected as the initial table. This may improve the error correction capability without the expense of obtaining or generating soft interface read data.

As shown in this example, in some embodiments, the plurality of LLR mapping tables has a predefined selection sequence including a first predefined selection (e.g., the first hard-input LLR mapping table (800b) in FIG. 8B), and selecting one of the plurality of LLR mapping tables includes: determining whether the Flash storage is in a low signal-to-noise (SNR) state; and in the event it is determined that the Flash storage is in the low SNR state, selecting an LLR mapping table other than the first predefined selection (e.g., first soft-input LLR mapping table (806b) in FIG. 8B) to be an initial table.

In some embodiments, the determination of whether the Flash storage is in a low SNR state is based at least in part on one or more of the following: a temperature of the Flash storage, a number of program or erase cycles associated with the Flash storage (i.e., the age of the Flash storage), or failure state information associated with the finite-precision LDPC decoder (e.g., the LDPC decoder has failed more than a threshold number of times over some window of recent decoding attempts).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
  (A) a log-likelihood ratio (LLR) mapping block, wherein:
    (I) the LLR mapping block receives read data associated with Flash storage that is in a Flash storage state that includes one or more of the following: a low signal-to-noise ratio (SNR) state or a high SNR state;
    (II) the LLR mapping block selects one of a plurality of log-likelihood ratio (LLR) mapping tables based at least in part on: (1) the Flash storage state and (2) a decoding attempt count associated with a finite-precision low-density parity-check (LDPC) decoder, wherein selecting one of the plurality of LLR mapping tables includes determining the Flash storage state based at least in part on one or more of the following: a temperature of the Flash storage, a number of program or erase cycles associated with the Flash storage, or failure state information associated with the finite-precision LDPC decoder; and
    (III) the LLR mapping block generates a set of one or more LLR values using the read data and the selected LLR mapping table, wherein each LLR value in the set of LLR values has a same finite precision as the finite-precision LDPC decoder; and (B) the finite-precision LDPC decoder having the same finite precision as the set of LLR values, wherein:
(I) the finite-precision LDPC decoder generates error-corrected read data using the set of LLR values; and
(II) the finite-precision LDPC decoder outputs the error-corrected read data.

2. The system recited in claim 1 further including the Flash storage.

3. The system recited in claim 1 further including:
the Flash storage; and
a Flash storage read interface, wherein:
the Flash storage read interface receives raw read data from the Flash storage; and
the Flash storage read interface uses the raw read data from the Flash storage to generate the read data associated with the Flash storage that is received by the LLR mapping block, including by generating a value and a reliability.

4. The system recited in claim 1, wherein the Flash storage state includes one or more of the following: a low signal-to-noise ratio (SNR) state or a high SNR state.

5. The system recited in claim 1, wherein a first number of bits associated with the read data is strictly less than a second number of bits associated with the finite-precision LDPC decoder.

6. The system recited in claim 1, wherein selecting one of the plurality of LLR mapping tables includes progressing through a predefined selection sequence associated with the plurality of LLR mapping tables in accordance with the decoding attempt count associated with the finite-precision LDPC decoder.

7. The system recited in claim 1, wherein the LLR mapping block and the finite-precision LDPC decoder are co-located on one or more of the following: a same application-specific integrated circuit (ASIC) or a same field-programmable gate array (FPGA).

8. A system, comprising:
(A) a log-likelihood ratio (LLR) mapping block, wherein:
(I) the LLR mapping block receives read data associated with Flash storage that is in a Flash storage state that includes one or more of the following: a low signal-to-noise ratio (SNR) state or a high SNR state;
(II) the LLR mapping block selects one of a plurality of log-likelihood ratio (LLR) mapping tables based at least in part on: (1) the Flash storage state and (2) a decoding attempt count associated with a finite-precision low-density parity-check (LDPC) decoder, wherein selecting one of the plurality of LLR mapping tables includes:
in the event the Flash storage state is the high SNR state, selecting a first LLR mapping table, in a predefined selection sequence associated with the plurality of LLR mapping tables, to be an initial table; and
in the event the Flash storage state is the low SNR state, selecting a second LLR mapping table, after the first LLR mapping table in the predefined selection sequence associated with the plurality of LLR mapping tables, to be the initial table; and
(III) the LLR mapping block generates a set of one or more LLR values using the read data and the selected LLR mapping table, wherein each LLR value in the set of LLR values has a same finite precision as the finite-precision LDPC decoder; and (B) the finite-precision LDPC decoder having the same finite precision as the set of LLR values, wherein:
(I) the finite-precision LDPC decoder generates error-corrected read data using the set of LLR values; and
(II) the finite-precision LDPC decoder outputs the error-corrected read data.

9. The system recited in claim 8, wherein:
the first LLR mapping table includes a hard-input LLR mapping table; and
the second LLR mapping table includes a soft-input LLR mapping table.

10. A system, comprising:
(A) a log-likelihood ratio (LLR) mapping block, wherein:
(I) the LLR mapping block receives read data associated with Flash storage that is in a Flash storage state;
(II) the LLR mapping block selects one of a plurality of log-likelihood ratio (LLR) mapping tables based at least in part on: (1) the Flash storage state and (2) a decoding attempt count associated with a finite-precision low-density parity-check (LDPC) decoder, wherein selecting one of the plurality of LLR mapping tables includes:
determining whether all hard-input LLR mapping tables in the plurality of LLR mapping tables have already been selected;
in the event it is determined that all the hard-input LLR mapping tables in the plurality of LLR mapping tables have already been selected, selecting an unselected, soft-input LLR mapping table from the plurality of LLR mapping tables to be the selected LLR mapping table; and
in the event it is determined that all the hard-input LLR mapping tables in the plurality of LLR mapping tables have not already been selected, selecting an unselected, hard-input LLR mapping table from the plurality of LLR mapping tables to be the selected LLR mapping table; and
(III) the LLR mapping block generates a set of one or more LLR values using the read data and the selected LLR mapping table, wherein each LLR value in the set of LLR values has a same finite precision as the finite-precision LDPC decoder; and (B) the finite-precision LDPC decoder having the same finite precision as the set of LLR values, wherein:
(I) the finite-precision LDPC decoder generates error-corrected read data using the set of LLR values; and
(II) the finite-precision LDPC decoder outputs the error-corrected read data.

11. A method, comprising:
(A) receiving, at a log-likelihood ratio (LLR) mapping block, read data associated with Flash storage that is in a Flash storage state that includes one or more of the following: a low signal-to-noise ratio (SNR) state or a high SNR state;
(B) selecting, at the LLR mapping block, one of a plurality of log-likelihood ratio (LLR) mapping tables based at least in part on: (1) the Flash storage state and (2) a decoding attempt count associated with a finite-precision low-density parity-check (LDPC) decoder, wherein selecting one of the plurality of LLR mapping tables includes determining the Flash storage state based at least in part on one or more of the following: a temperature of the Flash storage, a number of program or erase cycles associated with the Flash storage, or failure state information associated with the finite-precision LDPC decoder;

(C) generating a set of one or more LLR values using the read data and the selected LLR mapping table, wherein each LLR value in the set of LLR values has a same finite precision as the finite-precision LDPC decoder;
(D) generating, at the finite-precision LDPC decoder, error-corrected read data using the set of LLR values; and
(E) outputting, by the finite-precision LDPC decoder, the error-corrected read data.

12. The method recited in claim 11 further including:
receiving, at a Flash storage read interface, raw read data from the Flash storage; and
generating, at the Flash storage read interface, the read data associated with the Flash storage that is received by the LLR mapping block using the raw read data from the Flash storage, including by generating a value and a reliability.

13. The method recited in claim 11, wherein the Flash storage state includes one or more of the following: a low signal-to-noise ratio (SNR) state or a high SNR state.

14. The method recited in claim 11, wherein a first number of bits associated with the read data is strictly less than a second number of bits associated with the finite-precision LDPC decoder.

15. The method recited in claim 11, wherein selecting one of the plurality of LLR mapping tables includes progressing through a predefined selection sequence associated with the plurality of LLR mapping tables in accordance with the decoding attempt count associated with the finite-precision LDPC decoder.

16. The method recited in claim 10, wherein the LLR mapping block and the finite-precision LDPC decoder are co-located on one or more of the following: a same application-specific integrated circuit (ASIC) or a same field-programmable gate array (FPGA).

17. A method, comprising:
(A) receiving, at a log-likelihood ratio (LLR) mapping block, read data associated with Flash storage that is in a Flash storage state that includes one or more of the following: a low signal-to-noise ratio (SNR) state or a high SNR state;
(B) selecting, at the LLR mapping block, one of a plurality of log-likelihood ratio (LLR) mapping tables based at least in part on: (1) the Flash storage state and (2) a decoding attempt count associated with a finite-precision low-density parity-check (LDPC) decoder, wherein selecting one of the plurality of LLR mapping tables includes:
in the event the Flash storage state is the high SNR state, selecting a first LLR mapping table, in a predefined selection sequence associated with the plurality of LLR mapping tables, to be an initial table; and
in the event the Flash storage state is the low SNR state, selecting a second LLR mapping table, after the first LLR mapping table in the predefined selection sequence associated with the plurality of LLR mapping tables, to be the initial table;
(C) generating a set of one or more LLR values using the read data and the selected LLR mapping table, wherein each LLR value in the set of LLR values has a same finite precision as the finite-precision LDPC decoder;
(D) generating, at the finite-precision LDPC decoder, error-corrected read data using the set of LLR values; and
(E) outputting, by the finite-precision LDPC decoder, the error-corrected read data.

18. The method recited in claim 17, wherein:
the first LLR mapping table includes a hard-input LLR mapping table; and
the second LLR mapping table includes a soft-input LLR mapping table.

19. A method, comprising:
(A) receiving, at a log-likelihood ratio (LLR) mapping block, read data associated with Flash storage that is in a Flash storage state;
(B) selecting, at the LLR mapping block, one of a plurality of log-likelihood ratio (LLR) mapping tables based at least in part on: (1) the Flash storage state and (2) a decoding attempt count associated with a finite-precision low-density parity-check (LDPC) decoder, wherein selecting one of the plurality of LLR mapping tables includes:
determining whether all hard-input LLR mapping tables in the plurality of LLR mapping tables have already been selected;
in the event it is determined that all the hard-input LLR mapping tables in the plurality of LLR mapping tables have already been selected, selecting an unselected, soft-input LLR mapping table from the plurality of LLR mapping tables to be the selected LLR mapping table; and
in the event it is determined that all the hard-input LLR mapping tables in the plurality of LLR mapping tables have not already been selected, selecting an unselected, hard-input LLR mapping table from the plurality of LLR mapping tables to be the selected LLR mapping table;
(C) generating a set of one or more LLR values using the read data and the selected LLR mapping table, wherein each LLR value in the set of LLR values has a same finite precision as the finite-precision LDPC decoder;
(D) generating, at the finite-precision LDPC decoder, error-corrected read data using the set of LLR values; and
(E) outputting, by the finite-precision LDPC decoder, the error-corrected read data.

\* \* \* \* \*